United States Patent
Liu et al.

(10) Patent No.: US 8,158,986 B2
(45) Date of Patent: Apr. 17, 2012

(54) SYSTEM FOR DISPLAY IMAGES AND FABRICATION METHOD THEREOF

(75) Inventors: Yu-Chung Liu, Kaohsiung (TW); Te-Yu Lee, Jhubei (TW); Mei-Ling Chang, Gongguan Township (TW)

(73) Assignee: Chimei Innolux Corporation, Chu-Nan (TW)

( * ) Notice: Subject to any disclaimer, the term of this patent is extended or adjusted under 35 U.S.C. 154(b) by 177 days.

(21) Appl. No.: 12/764,005

(22) Filed: Apr. 20, 2010

(65) Prior Publication Data

US 2010/0270541 A1    Oct. 28, 2010

(30) Foreign Application Priority Data

Apr. 22, 2009    (TW) ................. 98113283 A

(51) Int. Cl.
*H01L 21/00* (2006.01)
*H01L 29/04* (2006.01)
*H01L 29/10* (2006.01)

(52) U.S. Cl. .............. 257/72; 257/59; 257/E51.022; 257/E33.053; 438/34

(58) Field of Classification Search ............ 257/71, 257/72, 59, E51.022, E33.053; 438/34, 99, 438/128, 155
See application file for complete search history.

(56) References Cited

U.S. PATENT DOCUMENTS

2009/0146927 A1 *   6/2009   Wan et al. ............... 345/76
* cited by examiner

*Primary Examiner* — Thomas L Dickey
*Assistant Examiner* — Nikolay Yushin
(74) *Attorney, Agent, or Firm* — Liu & Liu

(57) ABSTRACT

A system for displaying images including a display panel and a fabrication method thereof are provided. The display panel includes a substrate having a first, second and third areas, a first patterned semiconductor layer disposed over the first area of the substrate, a first insulating layer covering the first patterned semiconductor layer and the first, the second and the third areas of the substrate, a second patterned semiconductor layer disposed on the first insulating layer of the first and the third areas respectively, a second insulating layer covering the second patterned semiconductor layer and the first insulating layer, and a patterned conductive layer disposed on the second insulating layer to form a first thin-film transistor at the first area and a second thin-film transistor at the third area.

15 Claims, 12 Drawing Sheets

# SYSTEM FOR DISPLAY IMAGES AND FABRICATION METHOD THEREOF

CROSS REFERENCE TO RELATED APPLICATIONS

This Application claims priority of Taiwan Patent Application No. 98113283, filed on Apr. 22, 2009, the entirety of which is incorporated by reference herein.

BACKGROUND OF THE INVENTION

1. Field of the Invention

The invention relates to a system for displaying images including a display panel, and more particularly to a capacitor layout design for an organic light emitting diode display panel and a fabrication method thereof.

2. Description of the Related Art

Recently, organic light emitting diode (OLED) displays have been applied widely to display elements of various products. Of OLED displays, an active matrix organic light emitting diode (AMOLED) display usually utilizes thin film transistors (TFTs) for a switching element of a pixel area and for a driving element of a light emitting element.

Referring to FIG. 1, a schematic circuit of a pixel unit 100 of a conventional active matrix organic light emitting diode (AMOLED) display is shown. The pixel unit 100 has a driving TFT 112 for driving a light emitting element 116 such as an organic light emitting diode (OLED). In addition, a switching TFT 106 is applied to switch the states of the pixel unit 100 and a storage capacitor 108 is to store image data. A gate of the switching TFT 106 is coupled to a scanning line 102, a drain of the switching TFT 106 is coupled to a data line 104 and a source of the switching TFT 106 is coupled to one terminal of the storage capacitor 108 and a gate of the driving TFT 112. In addition, another terminal of the storage capacitor 108 is coupled to a power line 114 through a capacitor line 110 and coupled to a source of the driving TFT 112. Two terminals of the light emitting element 116 are coupled to an anode 118 and a cathode 120 respectively. A drain of the driving TFT 112 is coupled to the anode 118 of the light emitting element 116.

In general, an active layer of a thin film transistor of an AMOLED display is formed by a low temperature polysilicon process to satisfy with a heat-resistant temperature of a glass substrate of the AMOLED display. The active layer formed by the low temperature polysilicon process has several advantages such as high carrier mobility, high integrated driving circuit capability and low electric charge leakage. However, in addition to the above mentioned advantages, AMOLED displays need to have high storage capacitance and high aperture ratio.

Therefore, a layout design for a capacitor of an OLED display panel that satisfies the requirements for high storage capacitance and high aperture ratio is desirable.

BRIEF SUMMARY OF THE INVENTION

The invention provides a system for displaying images including a display panel. The display panel comprises a substrate having a first area, a second area and a third area. A first patterned semiconductor layer is disposed over the first area of the substrate. A first insulating layer is disposed to cover the first patterned semiconductor layer and the first, the second and the third areas of the substrate. A second patterned semiconductor layer is disposed on the first insulating layer of the first and the third areas respectively. A second insulating layer is disposed to cover the second patterned semiconductor layer and the first insulating layer and a patterned conductive layer is disposed on the second insulating layer. A first thin-film transistor comprises the first patterned semiconductor layer, the first insulating layer and the second patterned semiconductor layer at the first area, and a second thin-film transistor comprises the second patterned semiconductor layer, the second insulating layer and the patterned conductive layer at the third area.

The invention further provides a method for fabricating a system for displaying images, including forming a display panel. The method for forming the display panel comprises providing a substrate having a first area, a second area and a third area. A first patterned semiconductor layer is formed over the first area of the substrate. A first insulating layer is formed to cover the first patterned semiconductor layer and the substrate. A second patterned semiconductor layer is formed on the first insulating layer of the first and the third areas. A second insulating layer is formed to cover the second patterned semiconductor layer and a patterned conductive layer is formed on the second insulating layer of the first and the third areas. A first thin-film transistor comprises the first patterned semiconductor layer, the first insulating layer and the second patterned semiconductor layer of the first area, and a second thin-film transistor comprises the second patterned semiconductor layer, the second insulating layer and the patterned conductive layer of the third area.

A detailed description is given in the following embodiments with reference to the accompanying drawings.

BRIEF DESCRIPTION OF THE DRAWINGS

The invention can be more fully understood by reading the subsequent detailed description and examples with reference to the accompanying drawings, wherein.

DETAILED DESCRIPTION OF THE INVENTION

The following description is of the best-contemplated mode of carrying out the invention. The description is provided for illustrating the general principles of the invention and is not meant to be limiting. The scope of the invention is best determined by reference to the appended claims.

In an embodiment of the invention, a layout design for a capacitor of an organic light emitting diode display panel is improved to increase the storage capacitance and enhance aperture ration of the organic light emitting diode display panel.

Figure 1:
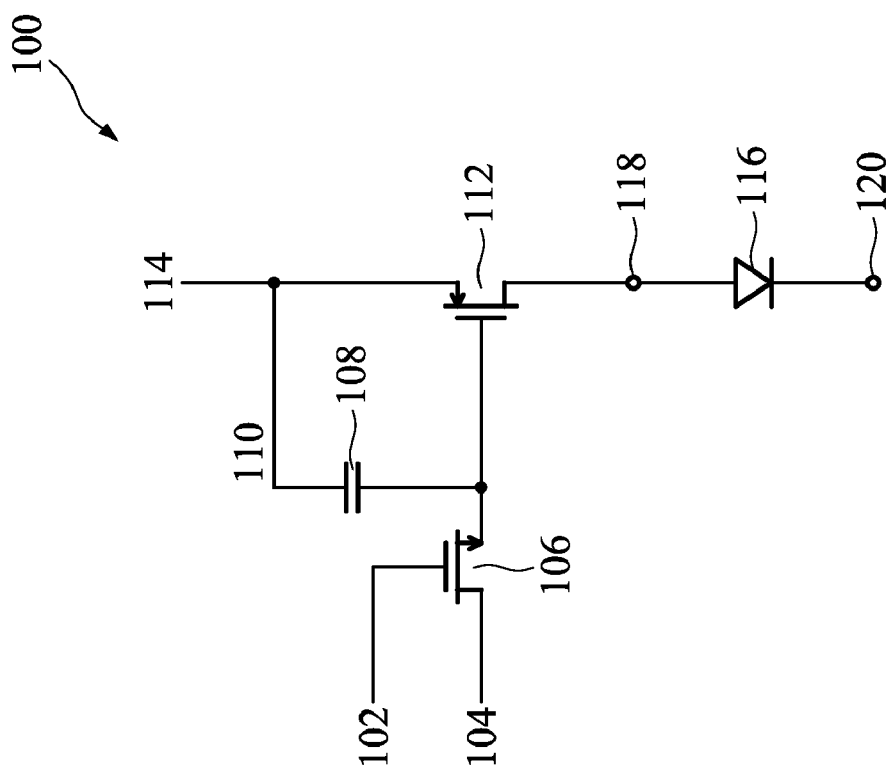
FIG. 1 is a schematic circuit of a pixel unit 100 of a conventional active matrix organic light emitting diode (AMOLED) display.
Figure 2:
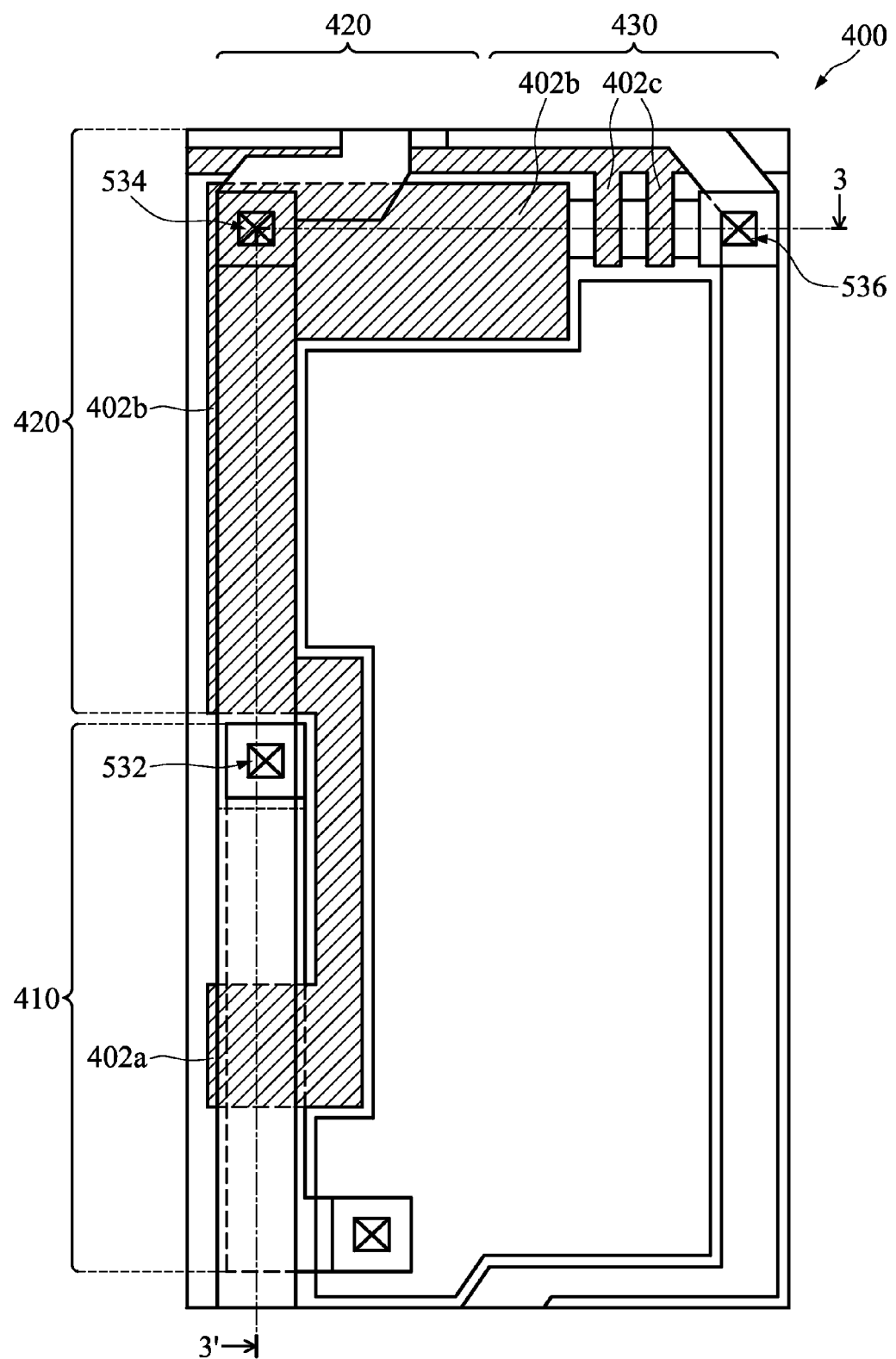
FIG. 2 is a schematic plane view of a sub-pixel area of an organic light emitting diode display panel according to an embodiment of the invention.

Referring to FIG. 2, a plane view of a sub-pixel area 400 of an organic light emitting diode display panel according to an embodiment of the invention is shown. The sub-pixel area 400 can be divided into a first area 410, a second area 420 and a third area 430 along a cross section line 3-3'. In this embodiment, a driving TFT is disposed at the first area 410, a capacitor is disposed at the second area 420 and a switching TFT is disposed at the third area 430. A patterned conductive layer 402a of the first area 410, a patterned conductive layer 402b of the second area 420 and the patterned conductive layer 402b of the third area 430 are used for an upper electrode layer of the capacitor. A plane view layout of the upper electrode layer is shown in 402a and 402b of FIG. 2. According to the capacitor layout design of this embodiment, the storage capacitance and the aperture ratio of the organic light emitting diode display panels of the invention can be enhanced.

Figure 3:
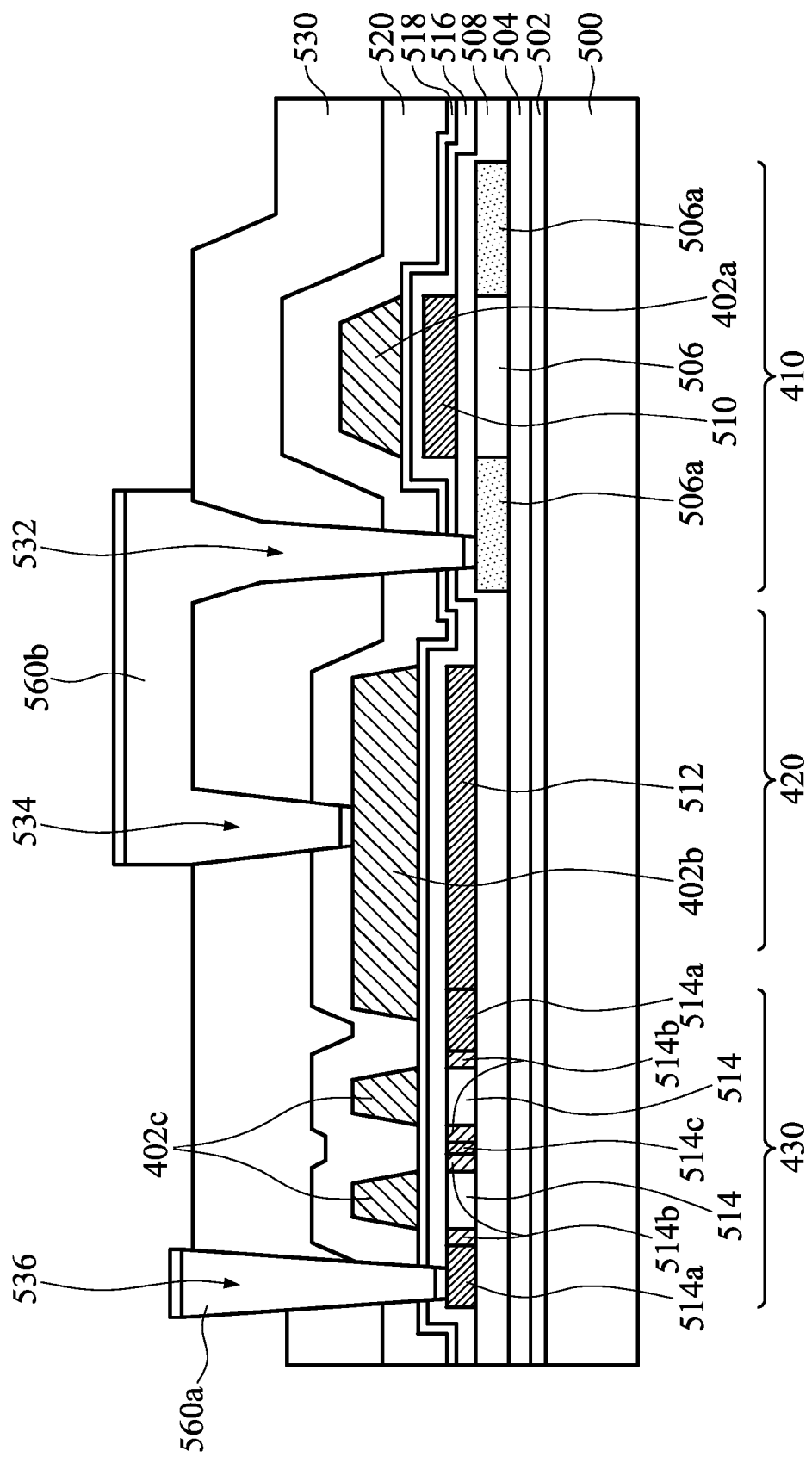
FIG. 3 is a schematic cross section along the line 3-3' of the display panel of FIG. 2 according to an embodiment of the invention.

Referring to FIG. 3, a schematic cross section along the cross section line 3-3' of the display panel of FIG. 2 according to an embodiment of the invention is shown. First dielectric layers 502 and 504 are formed to cover a substrate 500. First patterned semiconductor layers 506 and 506a are disposed on the first dielectric layers 502 and 504 of the first area 410. A first insulating layer 508 is formed to cover the first patterned semiconductor layers 506 and 506a and the first dielectric layers 502 and 504. Second patterned semiconductor layers 510, 512, 514, 514a, 514b and 514c are formed on the first insulating layer 508 at the first area 410, the second area 420 and the third area 430 respectively. Second insulating layers 516 and 518 are formed on the second patterned semiconductor layers 510, 512, 514, 514a, 514b and 514c. Then, patterned conductive layers 402a, 402b and 402c are formed on the second insulating layers 516 and 518 of the first area 410, the second area 420 and the third area 430, respectively, such that the driving TFT at the first area 410, the capacitor at the second area 420 and the switching TFT at the third area 430 are formed.

It is appreciated that in the display panel of FIG. 3, the patterned conductive layer 402a is disposed over a gate 510 of the driving TFT at the first area 410, such that an additional capacitor is formed at the first area 410. In addition, in this embodiment, the second patterned semiconductor layer 512 of the second area 420 and the second patterned semiconductor layer 514a of the third area 430 have the same first-typed conductance, for example an N-typed heavy doping polysilicon layer, and the second patterned semiconductor layers 512 and 514a are connected to each other.

Figure 4A:
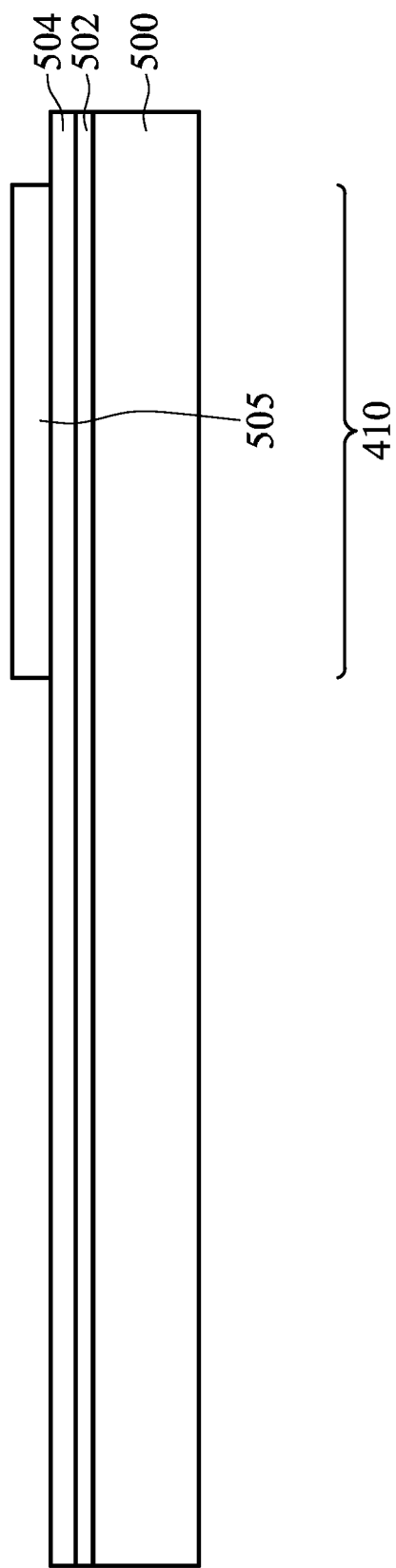
FIGS. 4A-4F are schematic cross sections of a method for fabricating the organic light emitting diode display panel of FIG. 3 according to an embodiment of the invention.

Referring to FIGS. 4A-4F, cross sections of a method for fabricating the display panel of FIG. 3 according to an embodiment of the invention are shown. Referring to FIG. 4A, the substrate 500 is provided first, for example a glass substrate or the other flexible plastic substrates. Two layers of the first dielectric layers 502 and 504 are formed on the substrate 500. Then, a first patterned intrinsic semiconductor layer 505 is formed on the first dielectric layer 504 at the first area 410.

Figure 4B:
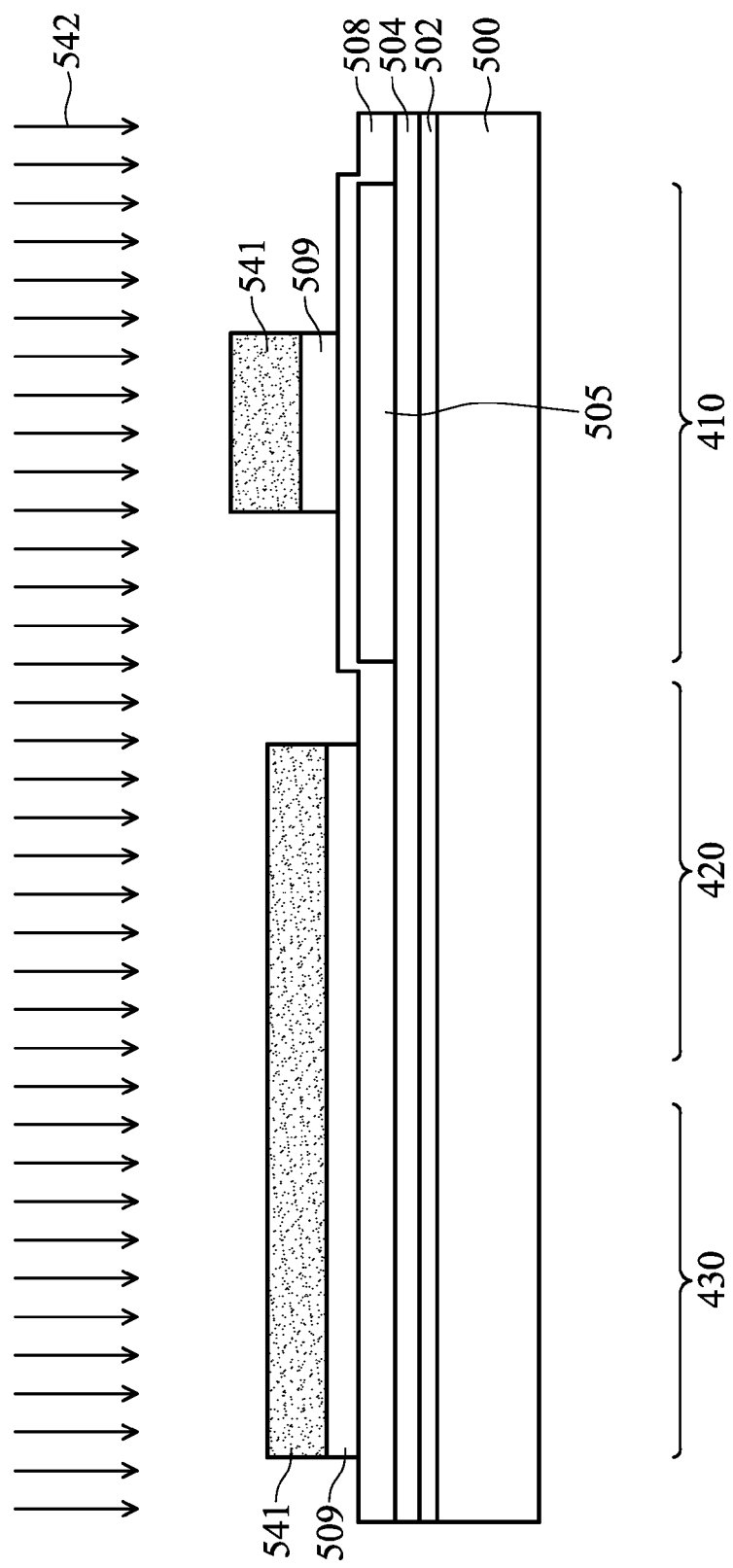

Referring to FIG. 4B, the first insulating layer 508 is formed to cover the first patterned intrinsic semiconductor layer 505 and the first dielectric layer 504. A patterning process is performed to the first insulating layer 508 at the first area 410, the second area 420 and the third area 430 to form a second patterned intrinsic semiconductor layer 509. Then, a mask 541 is disposed on the second patterned intrinsic semiconductor layer 509 and a heavy doping process 542 is performed to the first patterned intrinsic semiconductor layer 505. The heavy doping process 542 can be a P-typed heavy doping process or an N-typed heavy doping process.

Figure 4C:
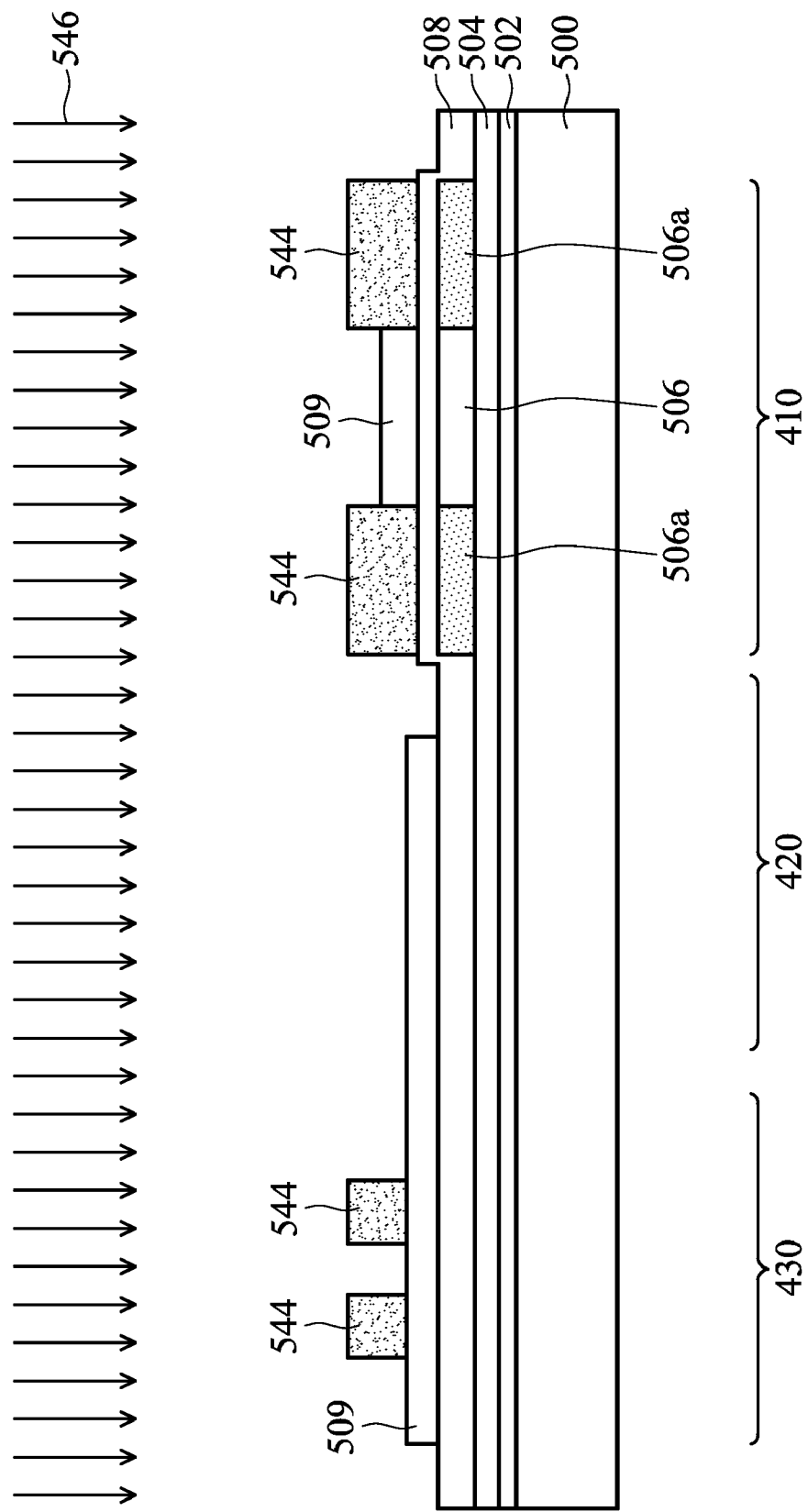

Referring to FIGS. 4B and 4C, after a heavily doped source/drain 506a and a polysilicon channel 506 are formed, the mask 541 is removed. Then, a mask 544 is disposed at the first area 410 and the third area 430 for performing a first-typed conductance lightly doping process 546 to the second patterned intrinsic semiconductor layer 509, wherein the first-typed conductance can be N-type conductance or P-type conductance. Next, referring to FIG. 4D, a second patterned semiconductor layer 514b with the first-typed lightly doped conductance is formed at the first area 410, the second area 420 and the third area 430. Then, a mask 548 is disposed on the second patterned semiconductor layer 514b at the third area 430 for performing a first-typed conductance heavily doping process 550, wherein the first-typed conductance can be N-type conductance or P-type conductance.

Figure 4D:
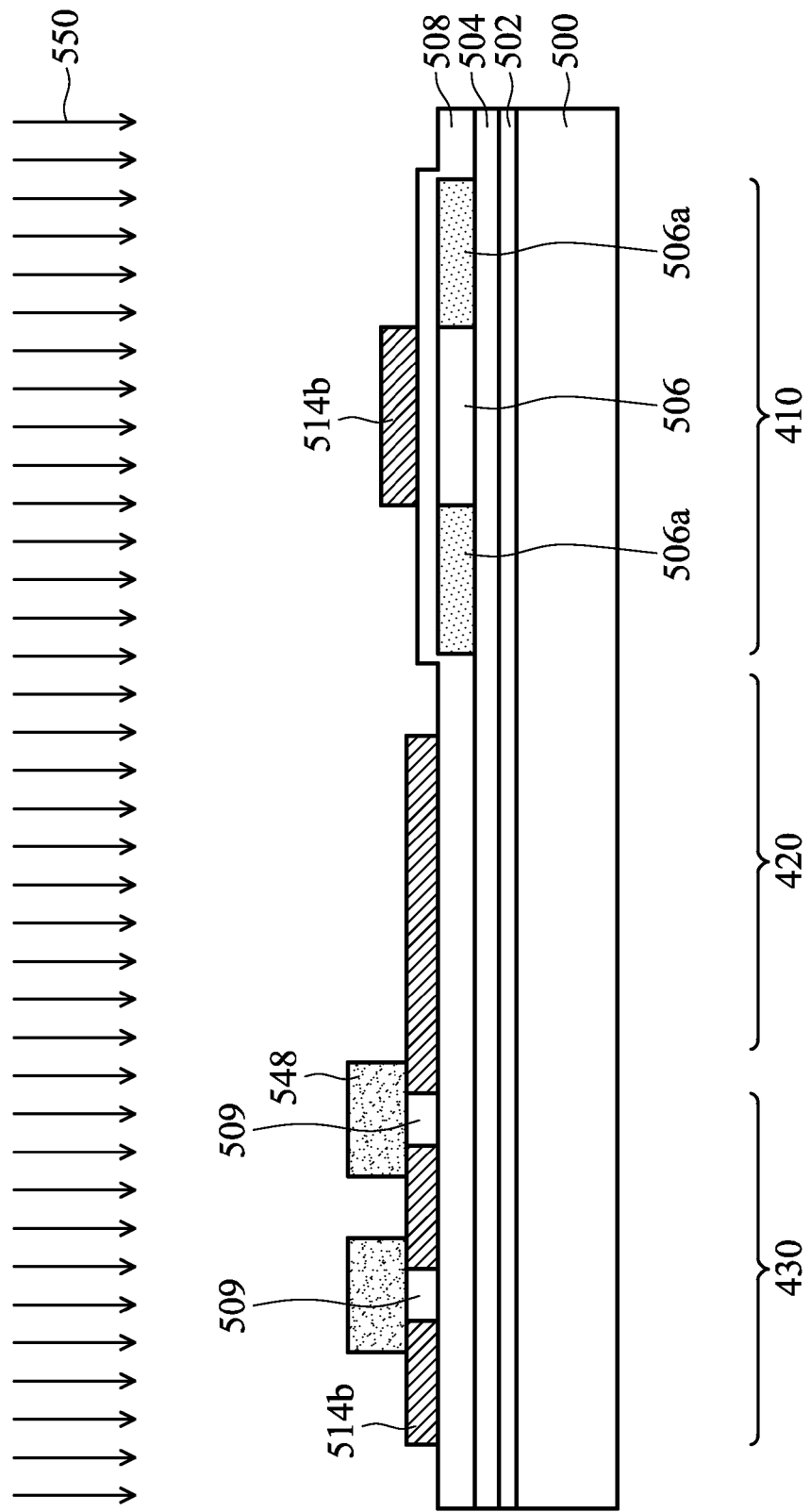
Figure 4E:
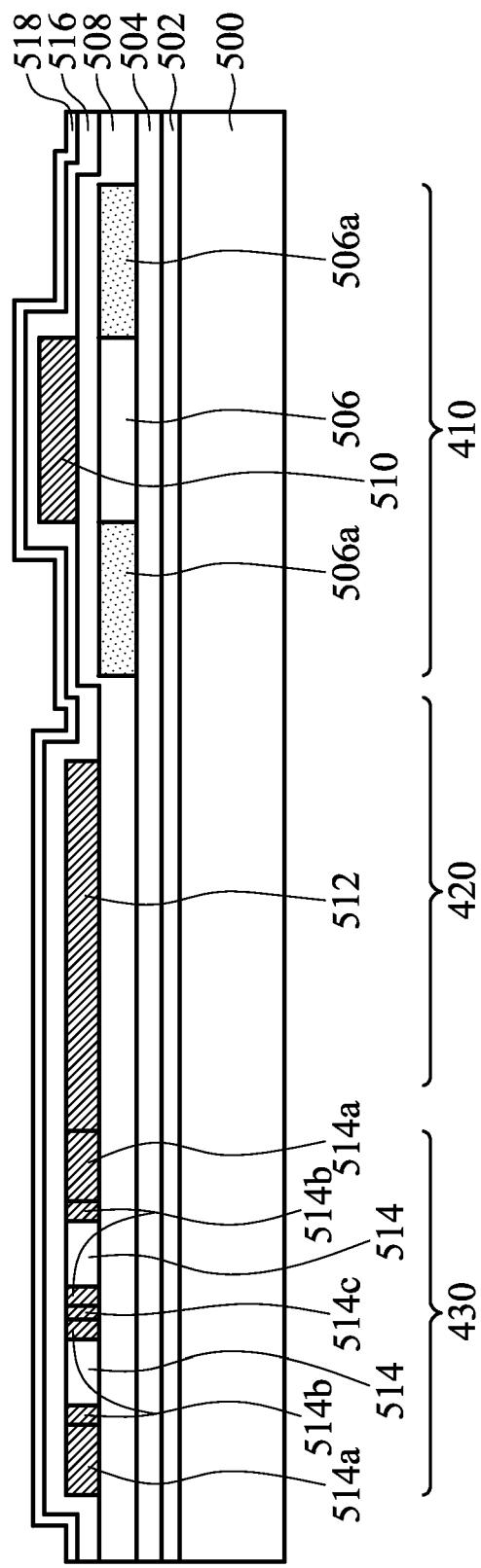

Referring to FIG. 4E, the mask 548 of FIG. 4D is removed, and the second patterned semiconductor layer 510 with the first-typed conductance is formed at the first area 410 as the gate of the driving TFT at the first area 410. The second patterned semiconductor layer 512 with the first-typed conductance is formed at the second area 420 as the lower electrode layer of the capacitor at the second area 420. The second patterned semiconductor layers 514a and 514c with the first-typed heavily doped conductance and the second patterned semiconductor layer 514b with the first-typed lightly doped conductance are formed at the third area 430 as the source/drain of the switching TFT at the third area 430, and an undoped polysilicom channel 514 is also formed. Then, two layers of the second insulating layers 516 and 518 are formed to cover the second patterned semiconductor layers 510, 512, 514, 514a, 514b and 514c.

Figure 4F:
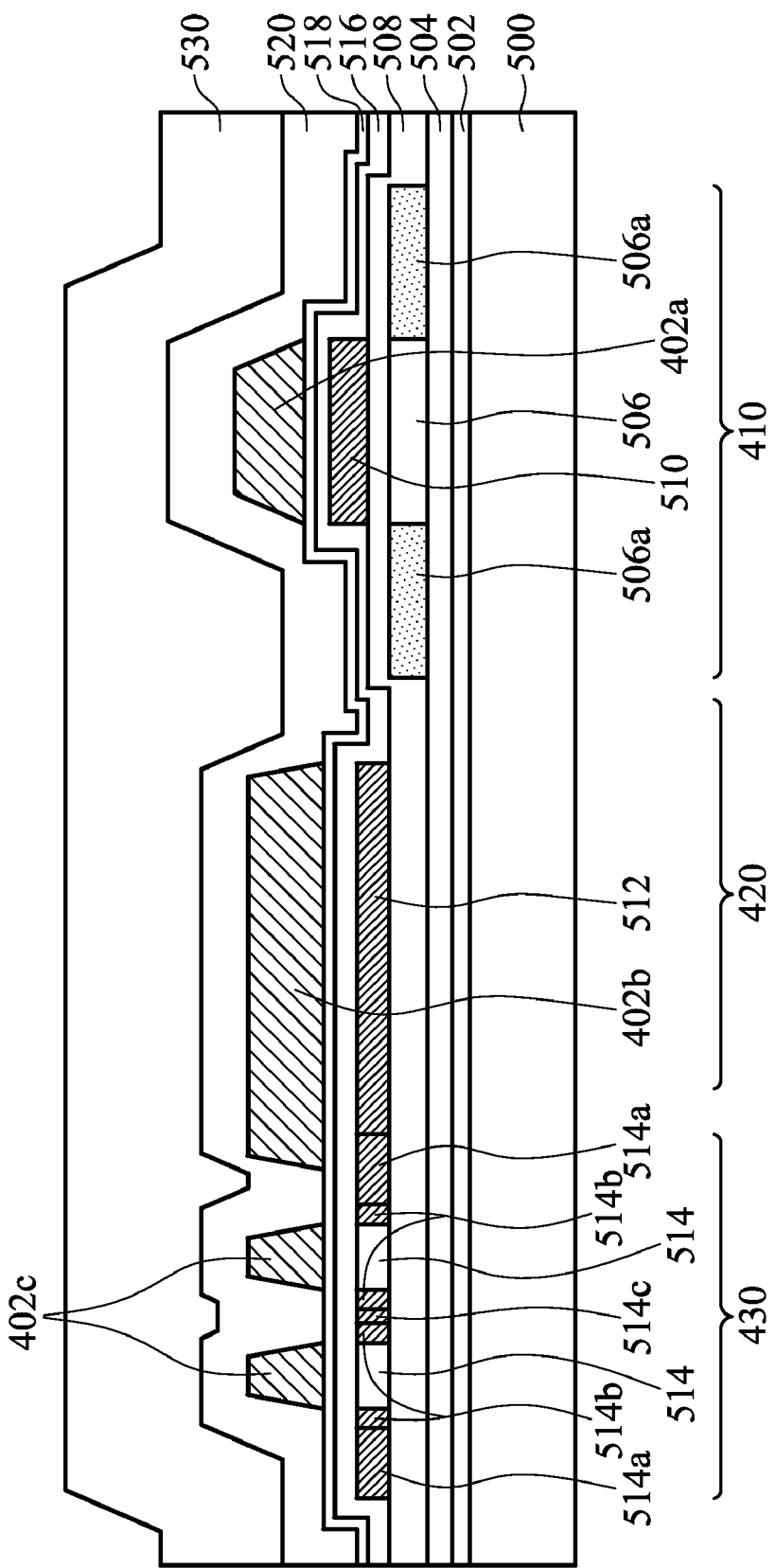

Referring to FIG. 4F, the patterned conductive layers 402a, 402b and 402c, for example a metal layer, are formed on the second insulating layer 518 respectively. Then, an additional capacitor is formed from the patterned conductive layers 402a and the second patterned semiconductor layer 510 of the driving TFT at the first area 410 to increase capacitance. The patterned conductive layer 402b at the second area 420 is used for the upper electrode layer of the capacitor. The patterned conductive layer 402c at the third area 430 is used for the gate of the switching TFT. In the embodiment, the switching TFT is a double gate TFT.

Referring to FIG. 3 again, a first contact hole is formed in the first insulating layer 508, the second insulating layers 516 and 518, and the second dielectric layers 520 and 530. A second contact hole 534 is formed in the second dielectric layers 520 and 530. A third contact hole 536 is formed in the second insulating layers 516 and 518, and the second dielectric layers 520 and 530. Then, patterned electrode layers 560a and 560b, for example a metal layer are formed on the second dielectric layers 520 and 530. The patterned electrode layer 560a is electrically connected to the second patterned semiconductor layer 514a at the third area 430 through the third contact hole 536. The patterned electrode layer 560b is electrically connected to the source 506a at the first area 410, the patterned electrode layer 402b at the second area 420 and the second patterned semiconductor layer 514a (source/drain) at the third area 430 through the first contact hole 532 and the second contact hole 534. In the embodiment, the two TFTs at the third area 430 both have first-typed (N-typed) conductance TFTs and the second patterned semiconductor layer 512 has a first-typed heavily doped conductance, such that the second patterned semiconductor layers 512, 514a, 514b and 514c at the second area 420 and the third area 430 are connected. Accordingly, the switching TFT at the third area 430 can be driven by the patterned electrode layer 560*b* and an additional electrode is not required. Therefore, the aperture ratio of the pixel can be effectively enhanced.

Figure 5:
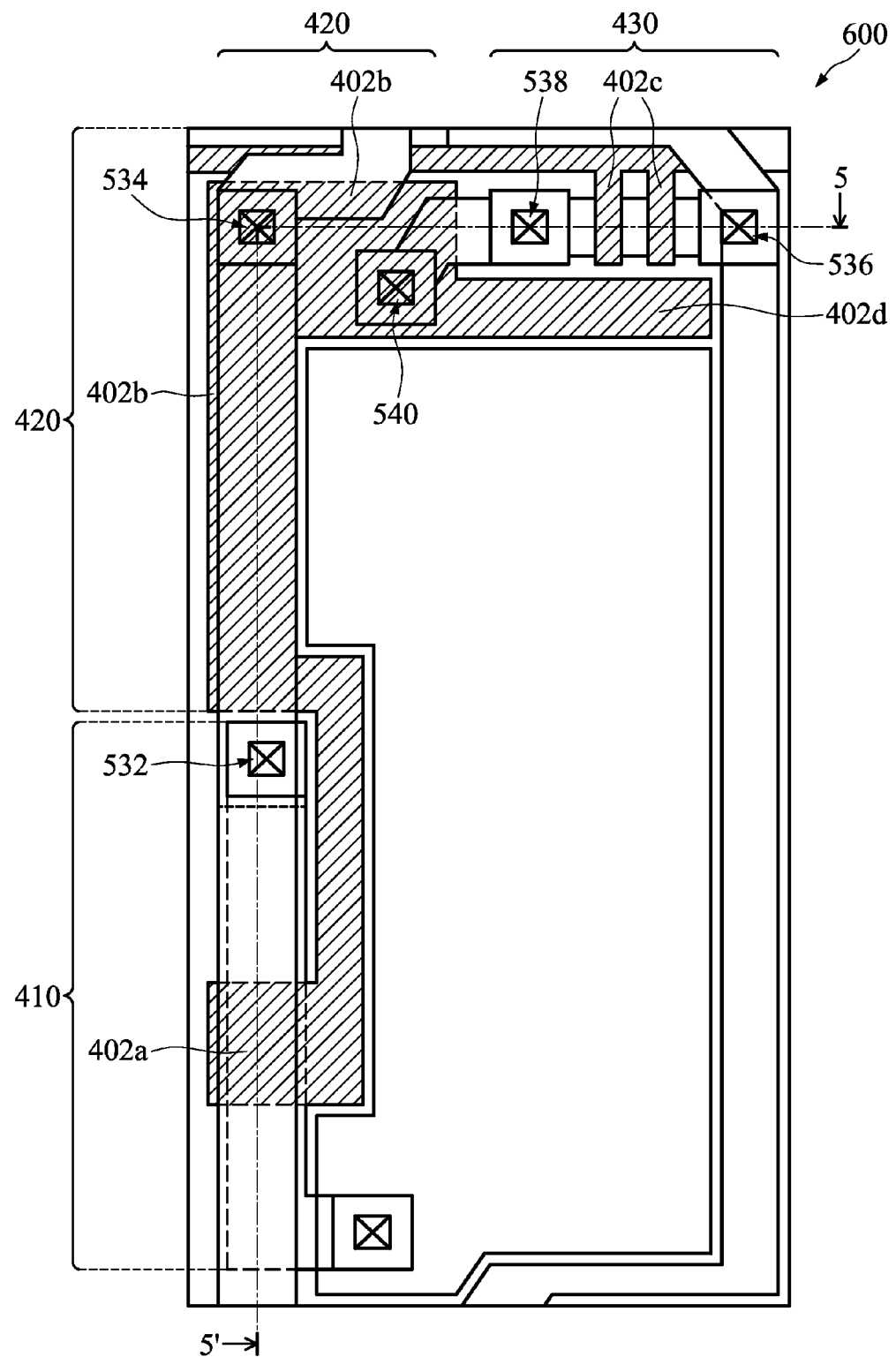
FIG. 5 is a schematic plane view of a sub-pixel area of an organic light emitting diode display panel according to another embodiment of the invention.

Referring to FIG. 5, a plane view of a sub-pixel area 600 of an organic light emitting diode display panel according to another embodiment of the invention is shown. The difference between the capacitor plane layouts of FIG. 5 and FIG. 2 is that the metal layer of the capacitor of FIG. 5 includes a protruding portion 402*d* extending to the third area 430.

Figure 6:
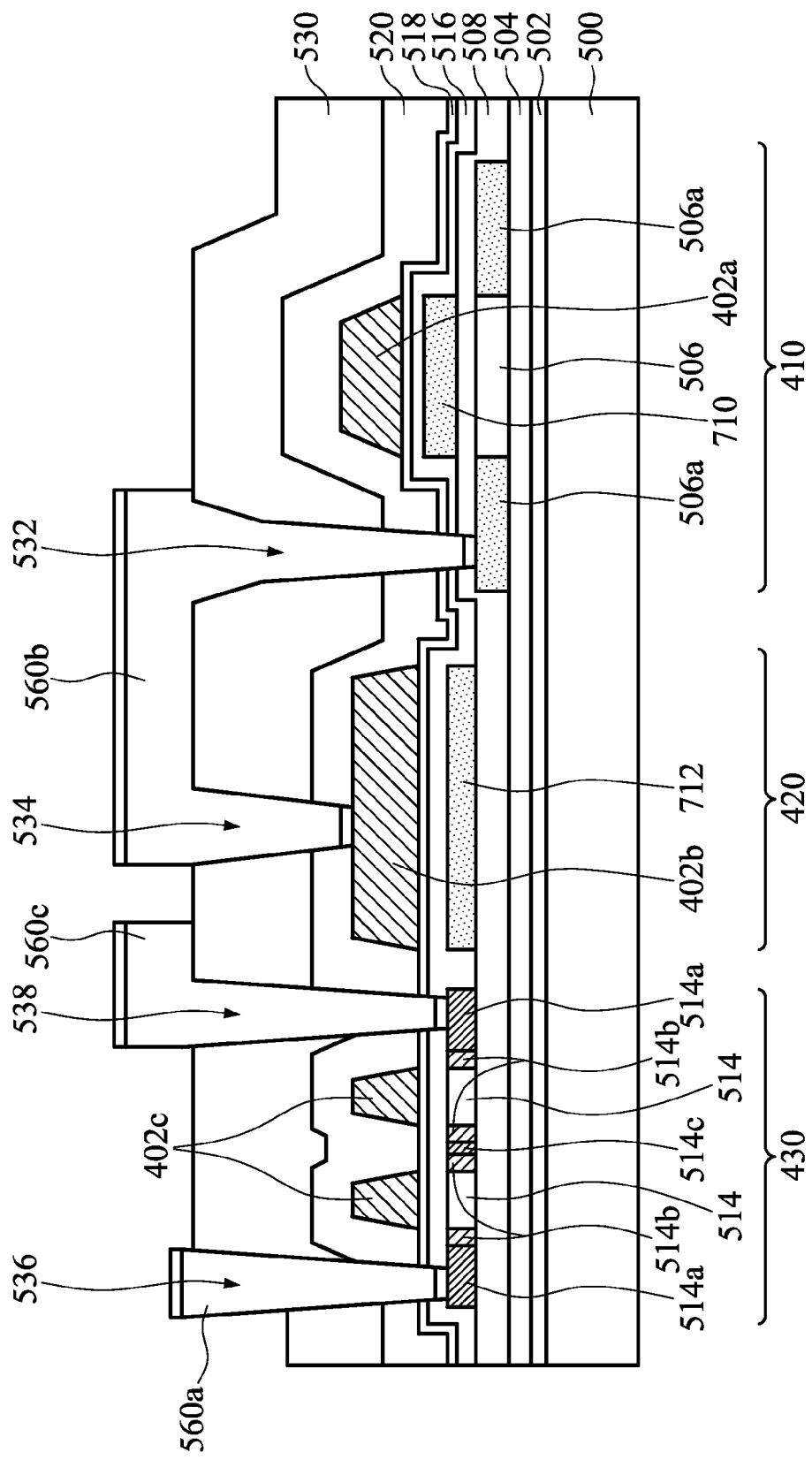
FIG. 6 is a schematic cross section along the line 5-5' of the display panel of FIG. 5 according to an embodiment of the invention.

Referring to FIG. 6, a cross section along the cross section line 5-5' of the display panel of FIG. 5 according to an embodiment of the invention is shown. The difference between FIG. 6 and FIG. 3 is that the gate 710 of the driving TFT at the first area 410 and the lower electrode layer 712 of the capacitor at the second area 420 both are the second patterned semiconductor layers of the same first-typed conductance, for example a P-typed heavily doped conductance. In addition, the second patterned semiconductor layer 514*a* at the third area 430 is a polysilicon layer of a second-typed conductance, for example an N-typed heavily doped conductance, which is not connected with the second patterned semiconductor layer 712 of the first-typed conductance, for example a P-typed heavily doped conductance, at the second area 420. Accordingly, a fourth contact hole 538 formed in the second insulating layers 516 and 518 and the second dielectric layers 520 and 530 at the third area 430 is required to expose the second patterned semiconductor layer 514*a* of the switching TFT at the third area 430. Then, the fourth contact hole 538 is filled with a patterned electrode layer 560*c* to electrically connect the capacitor at the second area 420 with the switching TFT at the third area 430. Referring to FIG. 5 again, a contact hole 540 is further formed on the second dielectric layer 530 at the second area 420 and the patterned electrode layer (not shown in FIG. 5) is electrically connected to the patterned electrode layer 560*c* through the contact hole 540.

The above mentioned dielectric layers 502, 504, 520 and 530 and the insulating layers 508, 516 and 518 can be silicon oxide, silicon nitride or the combinations thereof. The above mentioned first patterned semiconductor layers 506 and 506*a* and the second patterned semiconductor layers 510, 710, 512, 712, 514, 514*a*, 514*b* and 514*c* are formed by different crystallization processes. The first patterned semiconductor layers can be formed by a non-laser crystallization process, for example a solid state crystallization process, a metal-induced crystallization process, a metal-induced lateral crystallization process, an electric field enhanced metal-induced lateral crystallization process or an electric field enhanced rapid thermal annealing process. The second patterned semiconductor layers can be formed by a laser crystallization process, for example an excimer laser annealing process.

Although the above mentioned embodiments are illustrated with P-typed driving TFTs and N-typed switching TFTs to explain the invention, one skilled in the art can appreciate that N-typed driving TFTs and P-typed switching TFTs also can be used in the organic light emitting diode display panel of the invention. The combinations of N-typed or P-typed doping of each polysilicon layer are not limited to the above mentioned embodiments, and can be selected and combined according to requirements.

The organic light emitting diode display panel of the invention utilizes a polysilicon layer as the gate of the driving TFT and forms a metal layer over the gate of the driving TFT to form an additional capacitor. In addition, the layout design of the upper electrode layer of the capacitor can increase the storage capacitance and the aperture ratio of the display panels. Meanwhile, the organic light emitting diode display panel of the invention further utilizes non-laser crystallization processes to form the active layer of the driving TFT and utilizes laser crystallization processes to form the active layer of the switching TFT, such that light emitting uniformity of the display panels can be improved.

Figure 7:
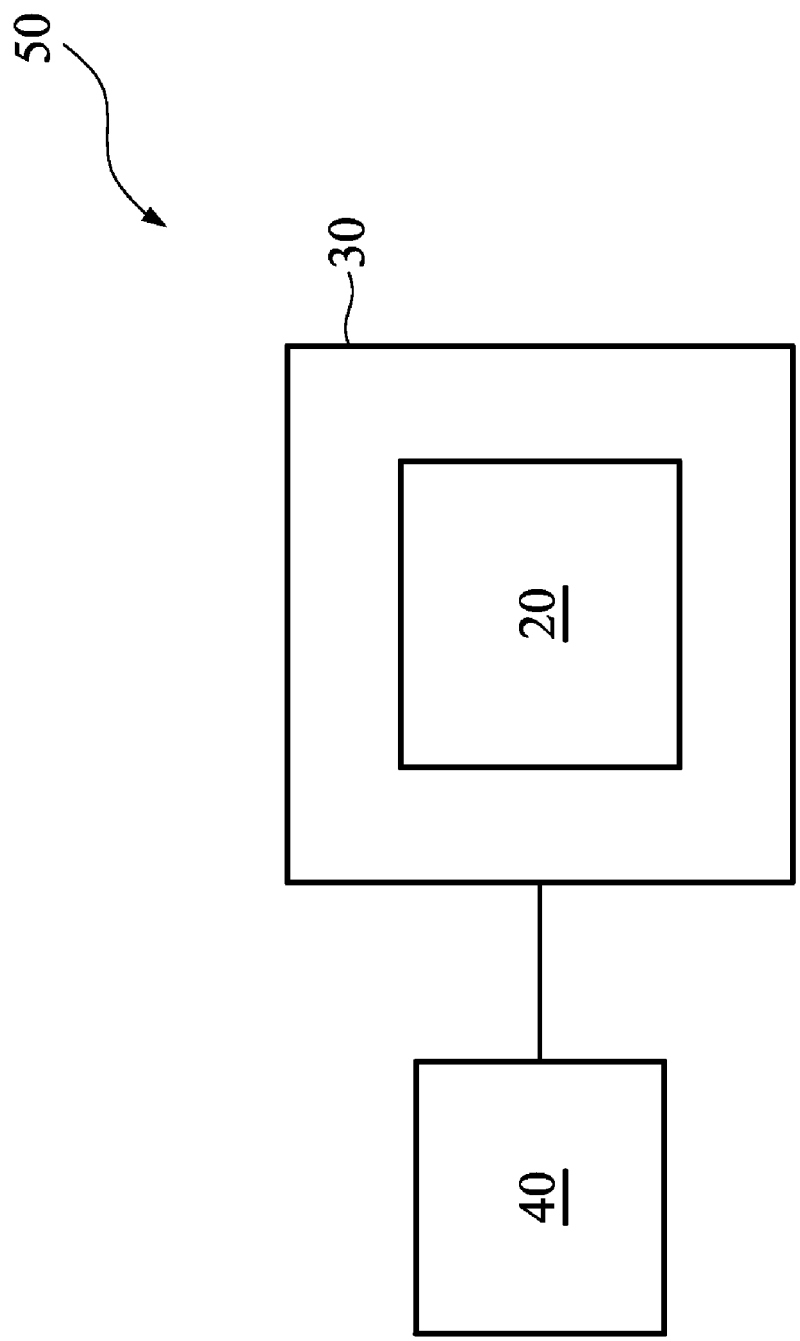
FIG. 7 schematically shows a system for displaying images including the display panel according to an embodiment of the invention.

Referring to FIG. 7, a system for displaying images including the display panel according to an embodiment of the invention is shown. The system for displaying images is such as an electronic device 50 or a display device 30. The display device 30 comprises a display panel 20 and the display device 30 is for example an organic light emitting diode display and the display panel 20 is for example an organic light emitting diode display panel. In general, the display device 30 can be a part of the electronic device 50 and the electronic device 50 further comprises an input unit 40 coupled to the display device 30, wherein the input unit 40 is operative to provide input to the display panel 20 such that the display panel 20 displays images. The system 50 for displaying images can be a mobile phone, digital camera, personal data assistant (PDA), notebook computer, desktop computer, television, car display or portable DVD player.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system for displaying images, comprising:
a display panel, comprising:
a substrate, having a first area, a second area and a third area;
a first patterned semiconductor layer disposed over the first area of the substrate;
a first insulating layer covering the first patterned semiconductor layer and the first, the second and the third areas of the substrate;
a second patterned semiconductor layer disposed on the first insulating layer of the first and the third areas respectively;
a second insulating layer covering the second patterned semiconductor layer and the first insulating layer; and
a patterned conductive layer disposed on the second insulating layer, wherein a first thin-film transistor comprises the first patterned semiconductor layer, the first insulating layer and the second patterned semiconductor layer at the first area, and a second thin-film transistor comprises the second patterned semiconductor layer, the second insulating layer and the patterned conductive layer at the third area.

2. The system as claimed in claim 1, wherein the second patterned semiconductor layer is disposed on the first insulating layer of the second area, the second patterned semiconductor layer of the second area is covered with the second insulating layer and the patterned conductive layer is disposed on the second insulating layer of the second area, wherein a capacitor comprises the second patterned semiconductor layer, the second insulating layer and the patterned conductive layer at the second area.

3. The system as claimed in claim 2, wherein the patterned conductive layer at the first area and the patterned conductive layer at the second area are connected to each other.

4. The system as claimed in claim 2, wherein the patterned conductive layer of the second area is extended to cover a portion of the second patterned semiconductor layer of the third area.

5. The system as claimed in claim 2, wherein the second patterned semiconductor layer at the second and the third areas have a first-typed conductance, and the second patterned semiconductor layer at the second and the third areas are connected to each other.

6. The system as claimed in claim 5, further comprising:
a first dielectric layer disposed between the substrate, the first patterned semiconductor layer and the first insulating layer;
a second dielectric layer covering the patterned conductive layer;
a first patterned electrode layer disposed on the second dielectric layer and electrically connected to the first patterned semiconductor layer of the first area and the patterned conductive layer of the second area through a first contact hole and a second contact hole respectively; and
a second patterned electrode layer disposed on the second dielectric layer and electrically connected to the second patterned semiconductor layer of the third area through a third contact hole.

7. The system as claimed in claim 2, wherein the second patterned semiconductor layer at the first and the second areas have a first-typed conductance, and the second patterned semiconductor layer at the third area has a second-typed conductance.

8. The system as claimed in claim 7, further comprising:
a first dielectric layer disposed between the substrate, the first patterned semiconductor layer and the first insulating layer;
a second dielectric layer covering the patterned conductive layer;
a first patterned electrode layer disposed on the second dielectric layer and electrically connected to the first patterned semiconductor layer of the first area and the patterned conductive layer of the second area through a first contact hole and a second contact hole respectively;
a second patterned electrode layer disposed on the second dielectric layer and electrically connected to the second patterned semiconductor layer of the third area through a third contact hole; and
a third patterned electrode layer disposed on the second dielectric layer and electrically connected to the second patterned semiconductor layer of the third area through a fourth contact hole.

9. The system as claimed in claim 5, wherein the patterned conductive layer of the second area is extended to dispose on the second patterned semiconductor layer of the third area.

10. The system as claimed in claim 1, further comprising a display device, wherein the display device comprises the display panel, and the display device is an organic light emitting diode display.

11. The system as claimed in claim 10, further comprising:
an electronic device, comprising:
the display device; and
an input unit coupled to the display device, wherein the electronic device comprises a mobile phone, digital camera, personal data assistant (PDA), notebook computer, desktop computer, television, car display or portable DVD player.

12. A method for fabricating a system for displaying images, including forming a display panel, comprising:
providing a substrate, having a first area, a second area and a third area;
forming a first patterned semiconductor layer over the substrate of the first area;
forming a first insulating layer to cover the first patterned semiconductor layer and the substrate;
forming a second patterned semiconductor layer on the first insulating layer of the first and the third areas;
forming a second insulating layer to cover the second patterned semiconductor layer; and
forming a patterned conductive layer on the second insulating layer of the first and the third areas,
wherein a first thin-film transistor comprises the first patterned semiconductor layer, the first insulating layer and the second patterned semiconductor layer of the first area, and a second thin-film transistor comprises the second patterned semiconductor layer, the second insulating layer and the patterned conductive layer of the third area.

13. The method as claimed in claim 12, further comprising:
forming the second patterned semiconductor layer on the first insulating layer of the second area;
forming the second insulating layer on the second patterned semiconductor layer of the second area; and
forming the patterned conductive layer on the second insulating layer of the second area, wherein a capacitor comprises the second patterned semiconductor layer, the second insulating layer and the patterned conductive layer of the second area.

14. The method as claimed in claim 13, wherein the patterned conductive layer at the first, the second and the third areas are also formed, and the patterned conductive layer at the first and the second areas are connected to each other.

15. The method as claimed in claim 13, further comprising:
forming an intrinsic semiconductor layer on the first insulating layer;
patterning the intrinsic semiconductor layer to form a patterned intrinsic semiconductor layer at the first, the second and the third areas together; and
performing a doping process to the patterned intrinsic semiconductor layer to form the second patterned semiconductor layer.

* * * * *